US010568251B2

(12) United States Patent
Onishi

(10) Patent No.: US 10,568,251 B2
(45) Date of Patent: Feb. 18, 2020

(54) COMPONENT MOUNTER, NOZZLE IMAGING METHOD

(71) Applicant: YAMAHA HATSUDOKI KABUSHIKI KAISHA, Shizuoka (JP)

(72) Inventor: Tadashi Onishi, Shizuoka (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 25 days.

(21) Appl. No.: 15/747,063

(22) PCT Filed: Aug. 31, 2015

(86) PCT No.: PCT/JP2015/074605
§ 371 (c)(1),
(2) Date: Jan. 23, 2018

(87) PCT Pub. No.: WO2017/037824
PCT Pub. Date: Mar. 9, 2017

(65) Prior Publication Data
US 2018/0376634 A1 Dec. 27, 2018

(51) Int. Cl.
*H05K 13/04* (2006.01)
*H05K 13/08* (2006.01)
*F21V 7/00* (2006.01)

(52) U.S. Cl.
CPC ....... *H05K 13/0452* (2013.01); *F21V 7/0066* (2013.01); *H05K 13/041* (2018.08); *H05K 13/0812* (2018.08); *H05K 13/0813* (2018.08)

(58) Field of Classification Search
CPC .............. H05K 13/08; H05K 13/0812; H05K 13/0813; H05K 13/0409; H05K 13/041; H05K 13/0452; F21V 7/0066
(Continued)

(56) References Cited

U.S. PATENT DOCUMENTS 5,452,080 A * 9/1995 Tomiya .............. H05K 13/0813
356/237.1
5,619,328 A * 4/1997 Sakurai .............. H05K 13/0813
356/621
(Continued)

FOREIGN PATENT DOCUMENTS

JP 2001-155160 A 6/2001
JP 2008-311476 A 12/2008
(Continued)

OTHER PUBLICATIONS

English translation of JP 2001-155160, published Jun. 8, 2001. Attained from ESPACENET on Apr. 12, 2019. (Year: 2001).*
(Continued)

*Primary Examiner* — Michael A Lyons
(74) *Attorney, Agent, or Firm* — Studebaker & Brackett PC

(57) ABSTRACT

A component mounter comprises first and second imaging systems, and a mounting head configured to hold a component by a nozzle. The first and second imaging systems irradiate light of first and second wavelengths, respectively, toward a working position to illuminate the nozzle located at the working position. The nozzle is imaged by the first and second imaging systems, respectively, that receive light having the first and second wavelengths, respectively, transmitted through first and second optical filters, respectively, after being irradiated on the working position. The first and second optical filters thus prevent light having wavelengths different from the first and second wavelengths from reaching the first and second imaging devices. Therefore, the nozzle can be imaged more precisely, since the influence of light different from the illumination light having the first and second wavelengths is suppressed by the first and second optical filters.

9 Claims, 5 Drawing Sheets

(58) Field of Classification Search
USPC .................................................. 356/613, 614
See application file for complete search history.

(56) References Cited

U.S. PATENT DOCUMENTS

| | | | | | |
|---|---|---|---|---|---|
| 6,128,034 | A | * | 10/2000 | Harris | H05K 13/0813 |
| | | | | | 348/87 |
| 6,195,165 | B1 | * | 2/2001 | Sayegh | H05K 13/0815 |
| | | | | | 356/613 |
| 7,239,399 | B2 | * | 7/2007 | Duquette | H05K 13/0812 |
| | | | | | 356/614 |
| 8,634,079 | B2 | * | 1/2014 | Onishi | H05K 13/0452 |
| | | | | | 356/446 |
| 2008/0013104 | A1 | * | 1/2008 | Gaida | H05K 13/0815 |
| | | | | | 356/614 |
| 2013/0250571 | A1 | | 9/2013 | Park et al. | |

FOREIGN PATENT DOCUMENTS

| | | |
|---|---|---|
| JP | 2012-212947 A | 11/2012 |
| JP | 2012-238726 A | 12/2012 |
| JP | 2013-131715 A | 7/2013 |
| JP | 2015-018992 A | 1/2015 |

OTHER PUBLICATIONS

International Search Report issued in PCT/JP2015/074605; dated Nov. 17, 2015.

* cited by examiner

COMPONENT MOUNTER, NOZZLE IMAGING METHOD

CROSS-REFERENCE TO RELATED APPLICATION

This application is a National Stage of International Patent Application No. PCT/JP2015/074605, filed Aug. 31, 2015, the entire content of which is incorporated herein by reference.

BACKGROUND

Technical Field

This disclosure relates to a nozzle imaging technique for imaging a nozzle used by a mounting head to hold a component.

Background Art

Conventionally, a component mounter is used which sucks a component fed by a feeder by a nozzle and mounts the sucked component on a board. In such a component mounter, the nozzle may fail to suck the component from the feeder or mount the component on the board. Accordingly, in JP2012-212947 and JP2008-311476, a nozzle after sucking a component or after mounting a component is imaged to confirm such a failure. Specifically, the nozzle is imaged by a camera while light is irradiated from an irradiator to the nozzle positioned at a predetermined station.

SUMMARY

This disclosure relates to a nozzle imaging technique for imaging a nozzle used by a mounting head to hold a component. However, in the case of imaging the nozzle by an imaging unit while irradiating light from an illuminator to the nozzle located at an imaging position in this way, there have been cases where light different from illumination light, e.g. natural light affects the imaging of the nozzle and the nozzle cannot be satisfactorily imaged.

This disclosure was developed in view of the above problem and aims to provide a technique enabling a nozzle to be satisfactorily imaged by suppressing the influence of light different from illumination light on the imaging of the nozzle in imaging the nozzle used by a mounting head to hold a component.

To achieve the above aim, a component mounter according to the present disclosure, comprises: a first imaging system including a first illuminator configured to irradiate light of a first wavelength toward a first imaging position, a first filter configured to limit the transmission of light of a wavelength different from the first wavelength while allowing the transmission of the light of the first wavelength, and a first imaging unit which faces the first imaging position and is configured to receive light incident thereon from the first imaging position by a first imaging device; and a mounting head configured to hold a component by a nozzle and position the nozzle at the first imaging position. The first imaging system images the nozzle located at the first imaging position by receiving the light transmitted through the first filter after being irradiated to the first imaging position from the first illuminator by the first imaging device of the first imaging unit.

To achieve the above aim, a nozzle imaging method according to the present disclosure, comprises: locating a nozzle used by a mounting head to hold a component at an imaging position; irradiating light of a predetermined wavelength toward the imaging position; and imaging the nozzle located at the imaging position by receiving the light transmitted through a filter after being irradiated to the imaging position by an imaging device. The filter limit the transmission of light of a wavelength different from the predetermined wavelength while allowing the transmission of the light of the predetermined wavelength.

In the thus configured disclosure (component mounter, nozzle imaging method), the light of the first wavelength (predetermined wavelength) is irradiated toward the first imaging position (imaging position) and this light functions as illumination light for illuminating the first imaging position. By receiving the light transmitted through the first filter (filter) after being irradiated to the first imaging position by the first imaging device (imaging device) of the first imaging unit (imaging unit), the nozzle located at the first imaging position is imaged. Here, the first filter limits the transmission of the light of a wavelength different from the first wavelength while allowing the transmission of the light of the first wavelength. In this way, it is suppressed that the light different from the illumination light of the first wavelength reaches the first imaging device through the first filter. As a result, the nozzle can be satisfactorily imaged by suppressing the influence of the light different from the illumination light on the imaging of the nozzle.

According to the disclosure, it is possible to satisfactorily image a nozzle by suppressing the influence of light different from illumination light on the imaging of the nozzle in imaging the nozzle used by a mounting head to hold a component.

DESCRIPTION OF EMBODIMENTS

Figure 1:
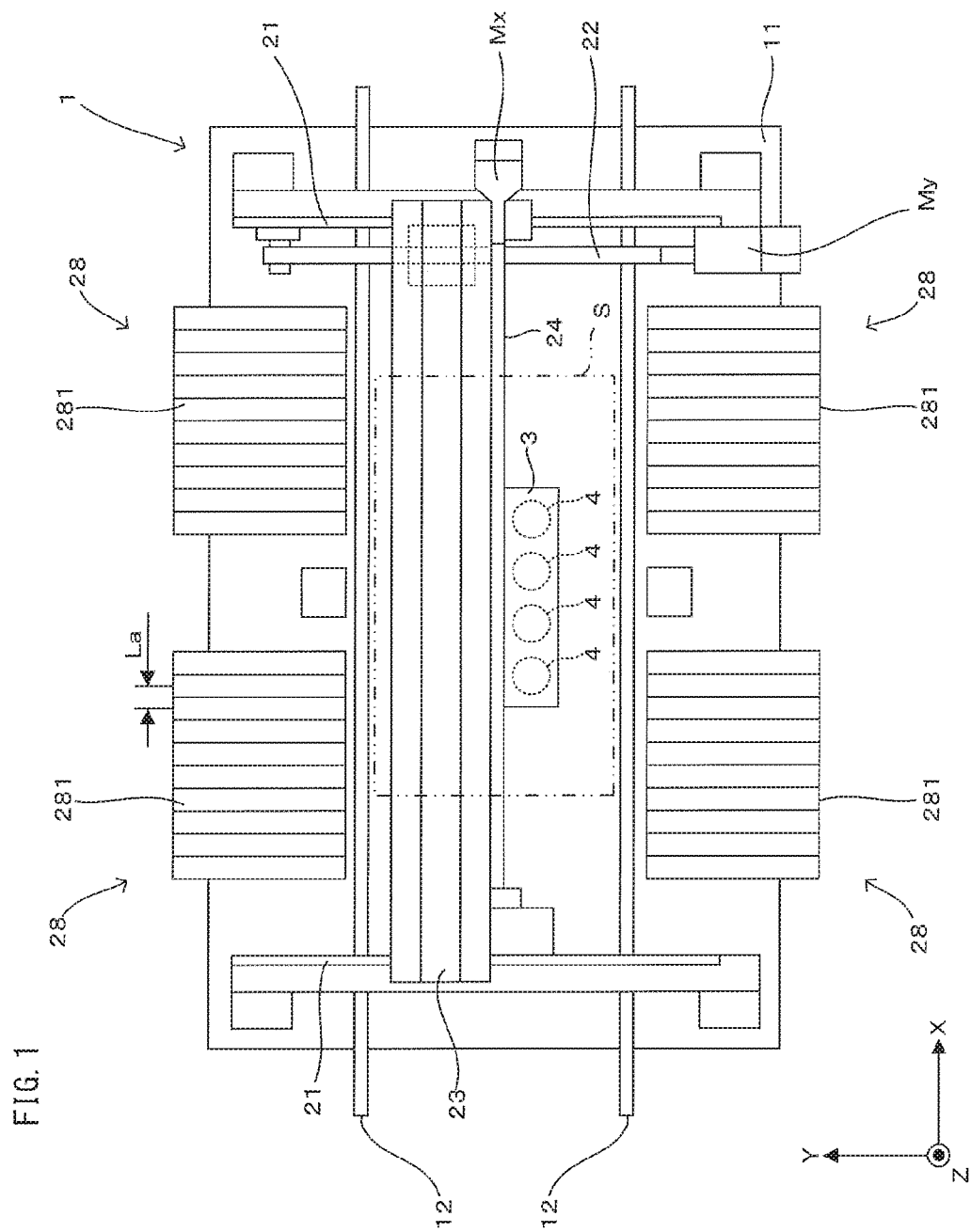
FIG. 1 is a partial plan view schematically showing a component mounter according to the disclosure.
Figure 2:
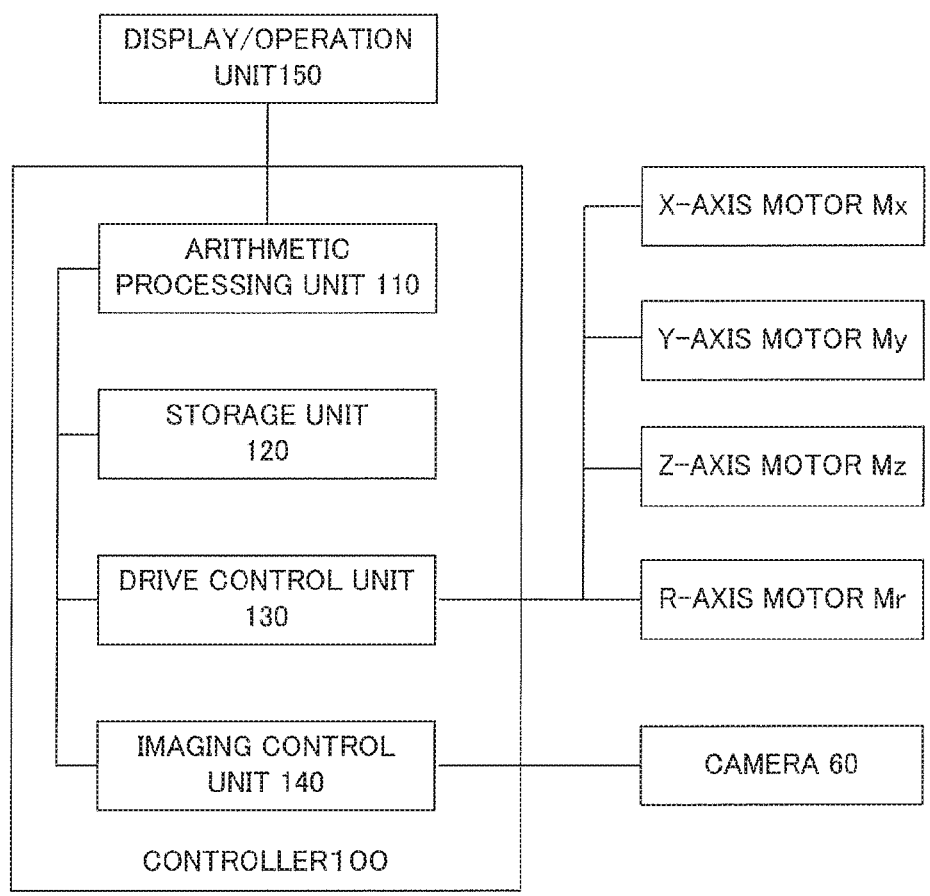
FIG. 2 is a block diagram showing an electrical configuration of the component mounter of FIG. 1.

FIG. 1 is a partial plan view schematically showing a component mounter according to the disclosure. FIG. 2 is a block diagram showing an electrical configuration of the component mounter of FIG. 1. In both FIGS. 1 and 2 and subsequent figures, an XYZ orthogonal coordinate system having a Z direction as a vertical direction is shown as appropriate. As shown in FIG. 2, the component mounter 1 includes a controller 100 configured to integrally control the entire machine. The controller 100 includes an arithmetic processing unit 110, which is a computer constituted by a CPU (Central Processing Unit) and a RAM (Random Access Memory), and a storage unit 120 constituted by an HDD (Hard Disk Drive). Further, the controller 100 includes a drive control unit 130 configured to control a drive system of the component mounter 1 and an imaging control unit 140 configured to control the imaging of a nozzle to be descried in detail later.

The arithmetic processing unit 110 performs the mounting of components specified by a program by controlling the drive control unit 130 in accordance with the program stored in the storage unit 120. At this time, the arithmetic processing unit 110 controls the mounting of components based on images imaged by cameras 60 through the imaging control unit 140. Further, the component mounter 1 is provided with a display/operation unit 150 and the arithmetic processing unit 110 causes the display/operation unit 150 to display a status of the component mounter 1 and receives an instruction from an operator input to the display/operation unit 150.

As shown in FIG. 1, the component mounter 1 includes a pair of conveyors 12, 12 provided on a base 11. The component mounter 1 mounts components on a board S carried to a mounting process position (position of the board S of FIG. 1) from an upstream side in an X direction (board conveying direction) by the conveyors 12 and carries the board S completed with the mounting of components from the mounting process position toward a downstream side in the X direction by the conveyors 12.

In the component mounter 1, a pair of Y-axis rails 21, 21 extending in a Y direction, a Y-axis ball screw 22 extending in the Y direction and a Y-axis motor My configured to rotationally drive the Y-axis ball screw 22 are provided, and a head supporting member 23 is fixed to a nut of the Y-axis ball screw 22 in a state supported on the pair of Y-axis rails 21, 21 movably in the Y direction. An X-axis ball screw 24 extending in the X direction and an X-axis motor Mx configured to rotationally drive the X-axis ball screw 24 are mounted on the head supporting member 23, and a head unit 3 is fixed to a nut of the X-axis ball screw 24 in a state supported on the head supporting member 23 movably in the X direction. Thus, the drive control unit 130 can move the head unit 3 in the Y direction by rotating the Y-axis ball screw 22 by the Y-axis motor My or move the head unit 3 in the X direction by rotating the X-axis ball screw 24 by the X-axis motor Mx.

Two component supplying units 28 are arranged side by side in the X direction at each of both sides of the pair of conveyors 12, 12 in the Y direction. A plurality of tape feeders 281 are detachably mounted side by side at an arrangement pitch La in the X direction on each component supplying unit 28, and a reel on which a tape accommodating components in the form of small pieces such as integrated circuits, transistors and capacitors (chip electronic components) at predetermined intervals is wound is arranged to each tape feeder 281. The tape feeder 281 supplies the components in the tape by intermittently feeding the tape toward the head unit 3.

The head unit 3 includes a plurality of (four) mounting heads 4 linearly arranged side by side in the X direction. Each mounting head 4 sucks/mounts components by nozzles 40 (FIG. 3) attached to a lower end. That is, the mounting head 4 moves to a position above the tape feeder 281 and sucks the component supplied by the tape feeder 281. Specifically, the mounting head 4 sucks the component by lifting the nozzle 40 while generating a negative pressure in the nozzle 40 after lowering the nozzle 40 until the nozzle 40 comes into contact with the component. Subsequently, the mounting head 4 moves to a position above the board S at the mounting process position and mounts the component on the board S. Specifically, the mounting head 4 mounts the component by generating an atmospheric pressure or positive pressure in the nozzle 40 after lowering the nozzle 40 until the component comes into contact with the board S.

Figure 3:
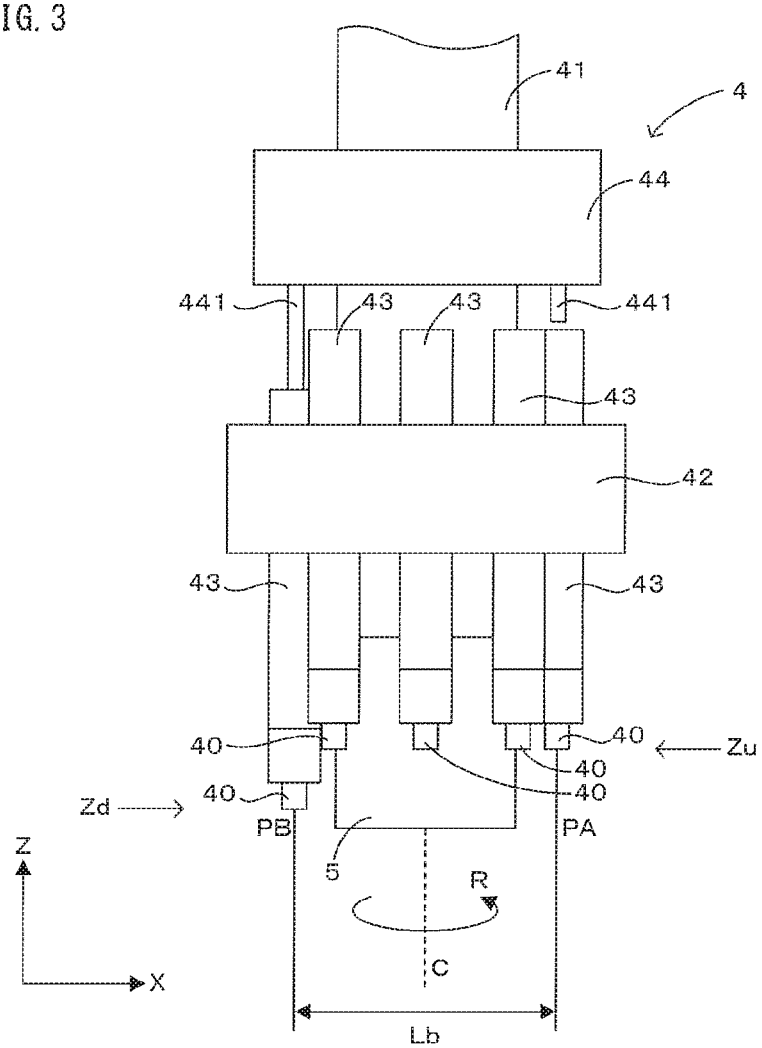
FIG. 3 is a partial front view schematically showing the vicinity of a lower end part of an example of the mounting head.
Figure 4:
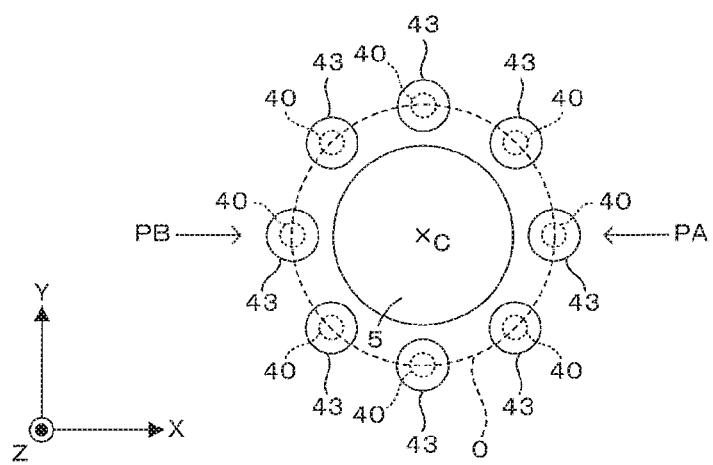
FIG. 4 is a partial plan view schematically showing a bottom part of the mounting head of FIG. 3.

FIG. 3 is a partial front view schematically showing the vicinity of a lower end part of an example of the mounting head. FIG. 4 is a partial plan view schematically showing a bottom part of the mounting head of FIG. 3. As shown in FIGS. 3 and 4, each mounting head 4 is a rotary head in which a plurality of nozzles 40 are circumferentially arranged. Next, the configuration of the mounting head 4 is described also using FIGS. 3 and 4. Note that since the four mounting heads 4 have a common configuration, one mounting head 4 is described here.

The mounting head 4 includes a main shaft 41 extending in the Z direction (vertical direction) and a nozzle holder 42 supported on the lower end of the main shaft 42. The nozzle holder 42 is supported rotatably in a rotating direction R about an rotation axis C (virtual axis) parallel to the Z direction, and rotates by receiving a drive force of an R-axis motor Mr (FIG. 2) provided on an upper end part of the mounting head 4. Further, the nozzle holder 42 supports a plurality of (eight) lifting shafts 43 circumferentially arranged at an equal angle about the rotation axis C.

Each lifting shaft 43 is supported to be movable upward and downward and biased upwardly by an unillustrated biasing member. The nozzle 40 is detachably attached to the lower end of each lifting shaft 43. In this way, the nozzle holder 42 supports a plurality of (eight) nozzles 40 circumferentially arranged at an equal angle about the rotation axis C. Thus, when the drive control unit 130 outputs a rotation command to the R-axis motor Mr, the plurality of nozzles 40 integrally rotate along a circumferential orbit O centered about the rotation axis C as the nozzle holder 42 rotates by receiving a drive force from the R-axis motor Mr.

Further, the main shaft 41 supports a nozzle lifting mechanism 44 above the plurality of lifting shafts 43. The nozzle lifting mechanism 44 includes two pressing members 441 arranged at an angle of 180° about the rotation axis C. The respective pressing members 44 move upward and downward independently of each other by receiving a drive force of a Z-axis motor Mz (FIG. 2) built-in the nozzle lifting mechanism 44. Thus, if the drive control unit 130 outputs a lowering command to the Z-axis motor Mz, the pressing members 441 move downward by receiving the drive force from the Z-axis motor Mz. In this way, each pressing member 441 lowers one lifting shaft 43 located right therebelow, out of the plurality of lifting shafts 43, against a biasing force acting on the lifting shaft 43, thereby lowering the nozzle 40 to a lowered position Zd where a component is sucked or mounted. On the other hand, if the drive control unit 130 outputs a lifting command to the Z-axis motor Mz, the pressing members 441 move upward by receiving the drive force from the Z-axis motor Mz. In this way, the one lifting shaft 43 pressed by the pressing member 441 is lifted together with the nozzle 40 according to the biasing force and the nozzle 40 moves upward to a lifted position Zu. Note that, in FIG. 3, each of the lowered position Zd and the lifted position Zu is shown with respect to the lower ends of the nozzles 40.

In such a mounting head 4, positions right below the pressing members 441 serves as working positions PA, PB where the component is sucked/mounted by the nozzle 40. Specifically, in the mounting head 4, two working positions PA, PB are provided at an angle of 180° about the rotation axis C in correspondence with the arrangement of the two pressing members 441 described above. On the other hand, as shown in FIG. 4, four pairs (nozzle pairs) of two nozzles 40 arranged at an interval of 180° about the rotation axis C (two nozzles 40 located on opposite sides across the rotation axis C) are provided in the nozzle holder 42, and 2×4 (eight) nozzles 40 are arranged along the circumferential orbit O. The two nozzles 40 paired in this way satisfy an arrangement relationship that the other nozzle 40 can be located at the working position PB at the same time as one nozzle 40 is located at the working position PA.

Accordingly, the drive control unit 130 can cause two nozzles 40 constituting one arbitrary nozzle pair, out of the four nozzle pairs, to be respectively located at the working positions PA, PB and use these nozzles 40 to suck/mount the components by adjusting rotational angles of the plurality of nozzles 40 by the R-axis motor Mr.

For example, in the case of sucking the component at the working position PA, the mounting head 4 is moved to a position above the component supplying unit 28 and the working position PA is located right above the tape feeder 281. In this state, the nozzle 40 not sucking any component is lowered from the lifted position Zu to the lowered position Zd in the Z direction while being stopped at the working position PA in a rotating direction R. Then, a negative pressure is given to the nozzle 40 at a timing at which the nozzle 40 touches a component supplied by the tape feeder 281, whereby the component is sucked to the nozzle 40 from the tape feeder 281. Subsequently, the nozzle 40 having sucked the component is lifted from the lowered position Zd to the lifted position Zu in the Z direction. The same applies also in the case of sucking a component at the working position PB. Particularly, two working positions PA, PB are provided side by side in the X direction and a center-to-center distance Lb of the two nozzles 40, 40 constituting the pair is equal to the arrangement pitch La (FIG. 1) of the tape feeders 281. Thus, the two nozzles 40, 40 located at the working positions PA, PB can simultaneously suck components from the tape feeders 281, 281.

Alternatively, in the case of mounting the component at the working position PA, the mounting head 4 is moved to a position above the board S and the working position PA is located right above a mounting target location of the board S. In this state, the nozzle 40 sucking the component is lowered from the lifted position Zu to the lowered position Zd in the Z direction while being stopped at the working position PA in the rotating direction R. Then, an atmospheric or positive pressure is given to the nozzle 40 at a timing at which the component touches the board S, whereby the component is mounted on the board S from the nozzle 40. Subsequently, the nozzle 40 separated from the component is lifted from the lowered position Zd to the lifted position Zu in the Z direction. The same applies also in the case of mounting the component at the working position PB.

Further, a cylindrical light diffusing member 5 is attached to the lower end of the main shaft 41 of the mounting head 4 and the plurality of nozzles 40 are arranged to surround the light diffusing member 5. This light diffusing member 5 has a configuration similar to a diffusing member described, for example, in JP 2012-238726A and is used for side view imaging of the nozzles 40 by an imaging unit 6 (FIGS. 5 and 6) to be described in detail later.

That is, in the component mounter 1, a side view of the nozzle 40 (side surface of the nozzle 40 viewed in the X direction) located at the lifted position Zu in the Z direction while being located at the working position PA, PB in the rotating direction R is imaged by the camera 60 of the imaging unit 6. Then, the arithmetic processing unit 110 controls the suction/mounting of the component by the nozzle 40, for example, as follows based on a side view image of the nozzle 40.

In the case of sucking a component, the side view of the nozzle 40 located at the lifted position Zu is imaged at timings before and after the suction of the component. If any foreign matter is adhering to the nozzle 40 in the side view image before the suction of the component, the suction of the component is stopped. Further, if there is no component on the lower end of the nozzle 40 in the side view image after the nozzle 40 was lowered to the lowered position Zd for the suction of the component, a failure in sucking the component is judged and it is tried again to suck the component. Furthermore, the thickness and posture of the component sucked by the nozzle 40 are also appropriately judged based on the side view image of the nozzle 40.

In the case of mounting a component, the side view of the nozzle 40 located at the lifted position Zu is imaged at timings before and after the mounting of the component. If there is no component on the lower end of the nozzle 40 in the side view image before the mounting of the component, it is judged that the component has come off from the nozzle 40 and the mounting of the component is stopped. Further, if there still remains the component on the lower end of the nozzle 40 in the side view image after the nozzle 40 was lowered to the lowered position Zd for the mounting of the component, a failure in mounting the component is judged and it is tried again to mount the component.

Figure 5:
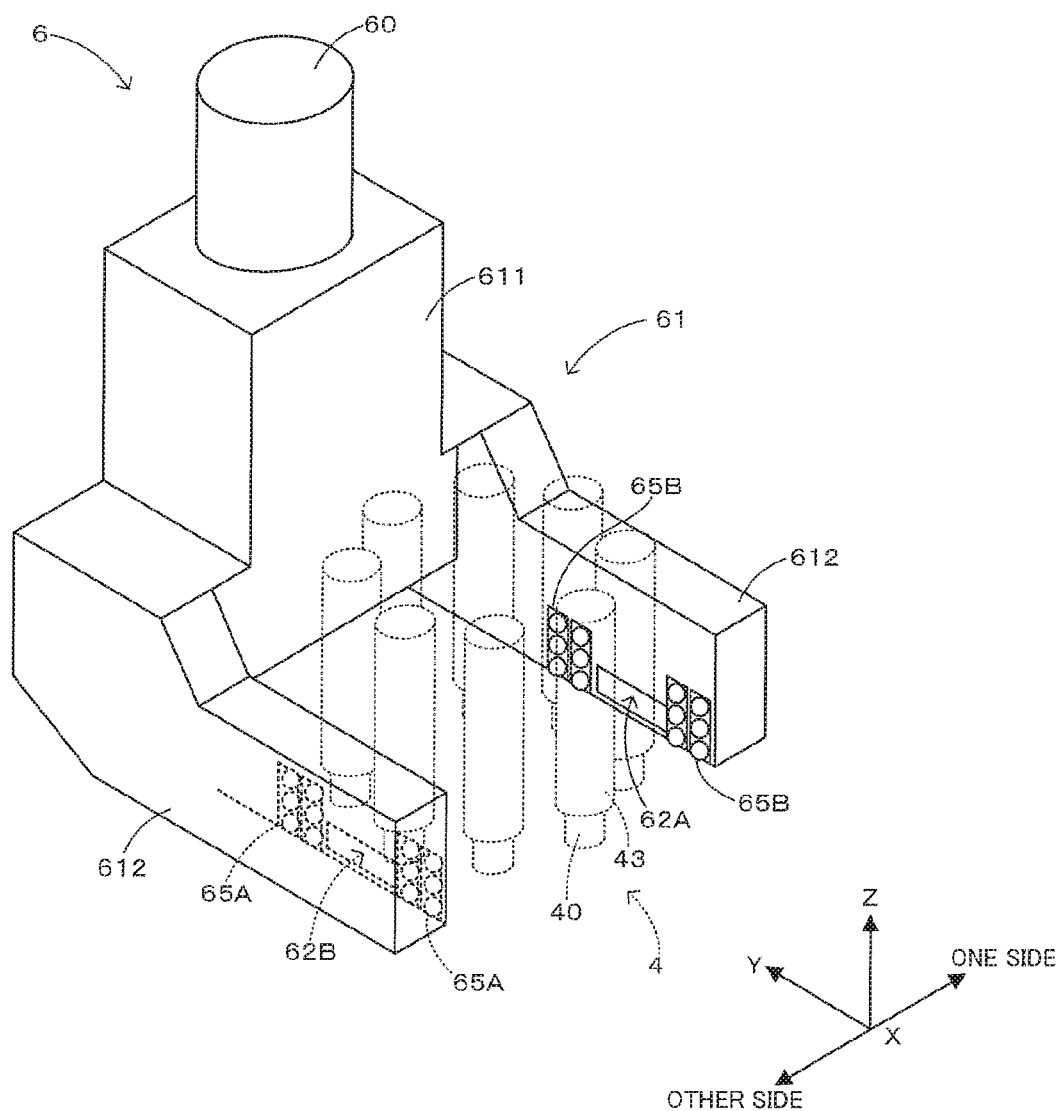
FIG. 5 is a partial perspective view schematically showing the external appearance of the imaging unit 5.
Figure 6:
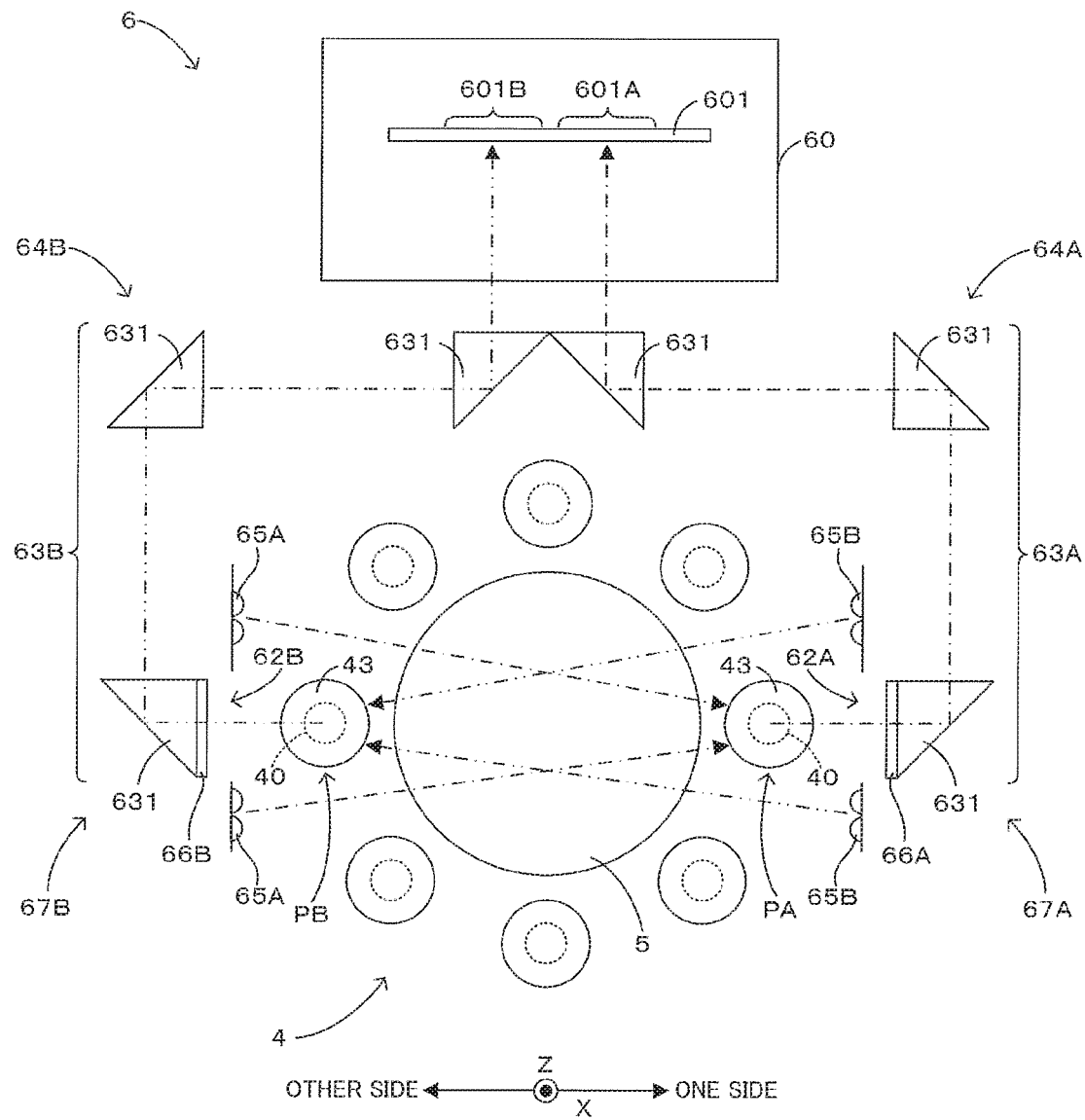
FIG. 6 is a diagram equivalently showing an optical configuration of the imaging unit of FIG. 5.

Next, the configuration of the imaging unit 6 is described also using FIGS. 5 and 6. FIG. 5 is a partial perspective view schematically showing the external appearance of the imaging unit 5. FIG. 6 is a diagram equivalently showing an optical configuration of the imaging unit of FIG. 5. Note that, in FIGS. 5 and 6, the configuration of the mounting head 4 is partially shown to show a relationship with the mounting head 4. This imaging unit 6 includes the camera 60 and images the nozzles 40 located at the working positions PA, PB by the camera 60.

A housing 61 of the imaging unit 6 includes a body part 611 having an inverted T-shape in a side view from the Y direction and having the camera 60 mounted on an upper part and two nozzle facing parts 612, 612 projecting in the Y direction from both ends of the body part 611 in the X direction. The imaging unit 6 is arranged to locate the plurality of nozzles 40 between the two nozzle facing parts 612, 612 in the X direction and fixed to the main shaft 4 of the mounting head 4. In this way, the imaging unit 6 is integrally configured to the mounting head 4 and movable together with the mounting head 4.

A first window 62A facing the working position PA on one side in the X direction is provided in an inner side wall of the nozzle facing part 612 on one side in the X direction, and a first optical system 63A including an optical elements 631 such as prisms, mirrors and lenses is provided in the nozzle facing part 612 on the one side and the body part 611. Light incident on the first window 62A from the working position PA is guided to the camera 60 by the first optical system 63A. In this way, a first range 601A of a solid-state imaging device 601 built in the camera 60 receives the light from the working position PA. That is, a first imaging unit 64A including the first window 62A, the first optical system 63A and the first range 601A of the solid-state imaging device 601 is arranged at one side of the mounting head 4. This first imaging unit 64A faces the working position PA provided with respect to one side surface of the mounting head 4 and images the working position PA.

Note that, as described above, the nozzle 40 moves upward and downward between the lifted position Zu and the lowered position Zd as the pressing member 441 moves upward and downward. In contrast, the first window 62A is arranged to face the tip of the nozzle 40 at the lifted position Zu at the working position PA and the first imaging unit 64A images the tip of the nozzle 40 located at the lifted position Zu at the working position PA in the X direction (horizontal direction) and obtains a side view image of the nozzle 40.

Further, first illuminators 65A configured to irradiate illumination light used in the imaging of the first imaging unit 64 is arranged in an inner side wall of the nozzle facing part 612 on the other side in the X direction. This first illuminator 65A includes a plurality of LEDs (Light Emitting Diodes) arranged in matrix on each of both sides of a second window 62B, and irradiates light of a first wavelength (blue wavelength) toward the working position PA from the other side in the X direction. In this way, light emitted from the first illuminators 65A arranged at the other side of the mounting head 4 in the X direction is irradiated to the working position PA after being diffused by the light diffusing member 5.

As just described, the first imaging unit 64A is arranged at the one side of the mounting head 4 and faces the working position PA on the one side surface of the mounting head 4. In contrast, the first illuminators 65A irradiate light to the working position PA from the other side of the mounting head 4. Thus, the first imaging unit 64A obtains a silhouette image of the nozzle 40 by imaging light irradiated by the first illuminators 65A from behind the nozzle 40 at the working position PA. This silhouette image is transferred from the solid-state imaging device 601 to the imaging control unit 140 and used to determine whether or not the component is sucked or mounted by the nozzle 40.

Further, a first optical filter 66A is provided on an incident surface (surface facing the first window 62A) of the optical element 631 arranged to face the first window 62A, out of the optical elements 631 constituting the first optical system 63A. This first optical filter 66A limits the transmission of light of a second wavelength (red wavelength) longer than the first wavelength while allowing the transmission of light of the first wavelength (blue wavelength). Thus, the first imaging unit 64A images the silhouette image of the nozzle 40 located at the working position PA by the light of the first wavelength.

At this time, filters of both an absorptive-type and a reflective-type can be used as the first optical filter 66A. Note that since the first optical filter 66A is arranged to face the first window 62A, reflected light by the first optical filter 66A can be allowed to escape to the outside of the housing 61 through the first window 62A even in the case of using a reflective-type optical filter. Thus, it can be suppressed that reflected light by the first optical filter 66A causes flare or ghost.

As just described, a first imaging system 67A is constituted by the first illuminators 65A, the first optical filter 66A and the first imaging unit 64A. The first imaging system 67A images the nozzle 40 located at the working position PA by receiving light transmitted through the first optical filter 66A after being irradiated to the working position PA from the first illuminators 65A by the solid-state imaging device 601 (first range 601A) of the first imaging unit 64A.

The second window 62B facing the working position PB on the other side in the X direction is provided in an inner side wall of the nozzle facing part 612 on the other side (side opposite to the one side) in the X direction, and a second optical system 63B including optical elements 631 is provided in the nozzle facing part 612 on the other side and the body part 611. Light incident on the second window 62B from the working position PB is guided to the camera 60 by the second optical system 63B. In this way, a second range 601B different from the first range 601A, out of the solid-state imaging device 601 built in the camera 60, receives the light from the working position PB. That is, a second imaging unit 64B including the second window 62B, the second optical system 63B and the second range 601B of the solid-state imaging device 601 is arranged at the other side of the mounting head 4. This second imaging unit 64B faces the working position PB provided with respect to other side surface of the mounting head 4 and images the working position PB.

Note that, as described above, the nozzle 40 moves upward and downward between the lifted position Zu and the lowered position Zd as the pressing member 441 moves upward and downward. In contrast, the second window 62B is arranged to face the tip of the nozzle 40 at the lifted position Zu at the working position PB and the second imaging unit 64B images the tip of the nozzle 40 located at the lifted position Zu at the working position PB in the X direction (horizontal direction) and obtains a side view image of the nozzle 40.

Further, second illuminators 65B configured to irradiate illumination light used in the imaging of the second imaging unit 64B is arranged in an inner side wall of the nozzle facing part 612 on the one side in the X direction. This second illuminator 65B includes a plurality of LEDs arranged in matrix on each of both sides of the first window 62A, and irradiates light of the second wavelength (red wavelength) toward the working position PB from the one side in X direction. In this way, light emitted from the second illuminators 65B arranged at the one side of the mounting head 4 in the X direction is irradiated to the working position PB after being diffused by the light diffusing member 5.

As just described, the second imaging unit 64B is arranged at the other side of the mounting head 4 and faces the working position PB on the other side surface of the mounting head 4. In contrast, the second illuminators 65B irradiate light to the working position PB from the one side of the mounting head 4. Thus, the second imaging unit 64B obtains a silhouette image of the nozzle 40 by imaging light irradiated by the second illuminators 65B from behind the nozzle 40 at the working position PB. This silhouette image is transferred from the solid-state imaging device 601 to the imaging control unit 140 and used to determine whether or not the component is sucked or mounted by the nozzle 40.

Further, a second optical filter 66B is provided on an incident surface (surface facing the second window 62B) of the optical element 631 arranged to face the second window 62B, out of the optical elements 631 constituting the second optical system 63B. This second optical filter 66B limits the transmission of light of the first wavelength (blue wavelength) shorter than the second wavelength while allowing the transmission of light of the second wavelength (red wavelength). Thus, the second imaging unit 64B images the silhouette image of the nozzle 40 located at the working position PB by the light of the second wavelength.

At this time, filters of both an absorptive-type and a reflective-type can be used as the second optical filter 66B. Note that since the second optical filter 66B is arranged to face the second window 62B, reflected light by the second optical filter 66B can be allowed to escape to the outside of the housing 61 through the second window 62B even in the case of using a reflective-type optical filter. Thus, it can be suppressed that reflected light by the second optical filter 66B causes flare or ghost.

As just described, a second imaging system 67B is constituted by the second illuminators 65B, the second optical filter 66B and the second imaging unit 64B. The second imaging system 67B images the nozzle 40 located at the working position PB by receiving light transmitted through the second optical filter 66B after being irradiated to the working position PB from the second illuminators 65B by the solid-state imaging device 601 (second range 601B) of the second imaging unit 64B.

As described above, in the first imaging system 67A of this embodiment, the light of the first wavelength is irradiated toward the working position PA and this light functions as illumination light for illuminating the working position PA. Then, by receiving the light transmitted through the first optical filter 66A after being irradiated to the working position PA by the solid-state imaging device 601 of the first optical system 63A, the nozzle 40 located at the working position PA is imaged. Here, the first optical filter 66A limits the transmission of the light of wavelengths different from the first wavelength while allowing the transmission of the light of the first wavelength. In this way, it is suppressed that the light different from the illumination light of the first wavelength reaches the solid-state imaging device 601 through the first optical filter 66A. As a result, the nozzle 40 can be satisfactorily imaged by suppressing the influence of the light different from the illumination light on the imaging of the nozzle 40. Further, the second imaging system 67B is also similarly configured and can satisfactorily image the nozzle 40.

Incidentally, in the case of providing the second imaging system 67B together with the first imaging system 67A as described above, the illumination light (light of the first wavelength, light of the second wavelength) used in each imaging system 67A, 67B may affect the imaging of the nozzle 40 corresponding to the other imaging system. Accordingly, by configuring the second imaging system 67B similarly to the first imaging system 67A, it is suppressed that light different from the illumination light of the second wavelength reaches the solid-state imaging device 601 through the second optical filter 66B in the second imaging system 67B. In addition, the first optical filter 66A of the first imaging system 67A limits the transmission of the light of the second wavelength used for illumination in the second imaging system 67B, and the second optical filter 66B of the second imaging system 67B limits the transmission of the light of the first wavelength used for illumination in the first imaging system 67A. Thus, the influence of the illumination light used by each of the first and second imaging systems 67A, 67B on the imaging of the nozzle 40 corresponding to the other imaging system is suppressed, and the nozzle 40 can be satisfactorily imaged in each of the first and second imaging systems 67A, 67B.

Further, in the case of imaging the silhouette images of the nozzles 40 by arranging the first and second imaging systems 67A, 67B as described above, the second illuminators 65B of the second imaging system 67B irradiate light toward the mounting head 4 from the one side of the mounting head 4 on which the first imaging unit 64A of the first imaging system 67A is arranged. Thus, there is a possibility that light irradiated from the second illuminators 65B of the second imaging system 67B and reflected by the mounting head 4 is incident on the first imaging unit 64A of the first imaging system 67A and affects the imaging of the nozzle 40 of the first imaging system 67A. Similarly, there is a possibility that light irradiated from the first illuminators 65A of the first imaging system 67A and reflected by the mounting head 4 is incident on the second imaging unit 64B of the second imaging system 67B and affects the imaging of the nozzle 40 of the second imaging system 67B. However, since the influence of the illumination light used by each of the first and second imaging systems 67A, 67B on the imaging of the nozzle 40 corresponding to the other imaging system is suppressed, the silhouette image of the nozzle 40 can be satisfactorily imaged in each of the first and second imaging systems 67A, 67B.

Further, an advantage of suppressing the influence of the illumination light used by each imaging system 67A, 67B on the imaging of the nozzle 40 corresponding to the other imaging system can be also utilized as follows. That is, the imaging control unit 140 may simultaneously perform the imaging of the nozzle 40 located at the working position PA by the first imaging system 67A and the imaging of the nozzle 40 located at the working position PB by the second imaging system 67B. This enables the nozzles 40 to be efficiently imaged. In addition, since the influence of the illumination light used by each of the first and second imaging systems 67A, 67B on the imaging of the nozzle 40 corresponding to the other imaging system is suppressed, the nozzles 40 can be satisfactorily imaged even if the imaging of each imaging system 67A, 67B is simultaneously performed.

Particularly, the above mounting head 4 is a rotary head and two nozzles 40 constituting the pair can satisfy the predetermined arrangement relationship and be respectively simultaneously located at the working positions PA and PB. This enables the plurality of nozzles 40 held by the rotary head 4 to be efficiently imaged.

At this time, the imaging control unit 140 may simultaneously image the nozzles 40, 40 after sucking the components respectively at the working positions PA, PB by the respective imaging systems 67A, 67B. In such a configuration, component sucking states of the two nozzles 40 can be efficiently imaged.

Further, the light used for illumination by the first imaging system 67A has the blue wavelength and the light used for illumination by the second imaging system 67B has the red wavelength. In such a configuration, since a wavelength difference of the light used for illumination by the first imaging system 67A and the light used for illumination by the second imaging system 67B (wavelength difference between blue light and red light) is large, the first optical filter 66A can effectively limit the transmission of the light used in the second imaging system 67B and the second optical filter 66B can effectively limit the transmission of the light used in the first imaging system 67A. Thus, the influence of the illumination light used by each of the first and second imaging systems 67A, 67B on the imaging of the nozzle 40 corresponding to the other imaging system can be more reliably suppressed.

As just described, in this embodiment, the component mounter 1 corresponds to an example of a "component mounter" of the disclosure, the mounting head 4 corresponds to an example of a "mounting head" of the disclosure, the imaging control unit 140 corresponds to an example of a "control unit" of the disclosure and the component supplying unit 28 corresponds to an example of a "component supplying unit" of the disclosure.

Further, the first imaging system 67A corresponds to an example of a "first imaging system" of the disclosure, the working position PA corresponds to an example of a "first imaging position" of the disclosure, the first illuminators 65A correspond to an example of a "first illuminator" of the disclosure, the first optical filter 66A corresponds to an example of a "first filter" of the disclosure, the first imaging unit 64A corresponds to an example of a "first imaging unit" of the disclosure, and the first range 601A of the solid-state imaging device 601 corresponds to an example of a "first imaging device" of the disclosure.

Further, the second imaging system 67B corresponds to an example of a "second imaging system" of the disclosure, the working position PB corresponds to an example of a "second imaging position" of the disclosure, the second illuminators 65B correspond to an example of a "second illuminator" of the disclosure, the second optical filter 66B corresponds to an example of a "second filter" of the disclosure, the second imaging unit 64B corresponds to an example of a "second imaging unit" of the disclosure, and the second range 601B of the solid-state imaging device 601 corresponds to an example of a "second imaging device" of the disclosure.

Note that the disclosure is not limited to the above embodiment and various changes can be made on the above embodiment without departing from the gist of the disclosure. Thus, for example, the "first wavelength" and the "second wavelength" in the disclosure may be respectively changed from the blue wavelength and the red wavelength described above. Specifically, the wavelength of the light irradiated by the first/second illuminators 65A, 65B and the wavelength of the light transmitted through the first/second optical filter 66A, 66B can be changed as appropriate.

Further, the imaging timing of the nozzle 40 by each imaging system 67A, 67B may be set to the one other than the above example as appropriate. Particularly, in the present embodiment, the influence of the illumination light used by each of the first and second imaging systems 67A, 67B on the imaging of the nozzle 40 corresponding to the other imaging system is suppressed. Thus, the first imaging system 67A may image the nozzle 40 at a suitable timing corresponding to the state of the nozzle 40 as an imaging object without particularly considering the timing of irradiating the illumination light in the second imaging system 67B. Specifically, the first imaging system 67A may image the nozzle 40 immediately when the nozzle 40 at the working position PA moves upward to the lifted position Zu without waiting for the imaging of the second imaging system 67B. Further, the second imaging system 67B may similarly image the nozzle 40 at a suitable timing. In this way, the control of the imaging timing in each of the first and second imaging systems 67A, 67B can be simplified.

Further, the provided positions of the first and second optical filters 66A, 66B can also be changed as appropriate without being limited to the above positions. Thus, for example, the first and second optical filters 66A, 66B may be provided by being fitted into the first and second windows 62A, 62B.

Further, the provided positions of the first and second illuminators 65A, 65B are also not limited to the above positions. Further, the light diffusing member 5 needs not necessarily be provided and the first and second illuminators 65A, 65B may directly irradiate light to the nozzles 40 at the working positions PA, PB.

Further, the positions where the nozzles 40 are sucked/mounted coincide with the positions where the nozzles 40 are imaged. However, these positions may be different.

Further, the component mounter 1 of the above embodiment includes two imaging systems 67A, 67B. However, the component mounter 1 may include a single first imaging system 67A.

As described above by exemplifying specific embodiments, according to the disclosure, for example, the component mounter may be configured to further comprises a second imaging system including a second illuminator configured to irradiate light of a second wavelength different from the first wavelength toward a second imaging position different from the first imaging position, a second filter configured to limit the transmission of light of a wavelength different from the second wavelength while allowing the transmission of the light of the second wavelength, and a second imaging unit which faces the second imaging position and is configured to receive light incident thereon from the second imaging position by a second imaging device, wherein: the mounting head is configured to position the nozzle at the second imaging position; the second imaging system images the nozzle located at the second imaging position by receiving the light transmitted through the second filter after being irradiated to the second imaging position from the second illuminator by the second imaging device of the second imaging unit; and the first filter limits the transmission of the light of the second wavelength and the second filter limits the transmission of the light of the first wavelength.

In the case of including the second imaging system together with the first imaging system as just described, illumination light (light of the first wavelength, light of the second wavelength) used by each imaging system may affect the imaging of the nozzle corresponding to the other imaging system. Accordingly, by configuring the second imaging system similarly to the first imaging system, it is suppressed that light different from the illumination light of the second wavelength reaches the second imaging device through the second filter in the second imaging system. In addition, the first filter of the first imaging system limits the transmission of the light of the second wavelength used for illumination in the second imaging system, and the second filter of the second imaging system limits the transmission of the light of the first wavelength used for illumination in the first imaging system. Thus, the influence of the illumination light used by each of the first and second imaging system on the imaging of the nozzle corresponding to the other imaging system is suppressed and the nozzle can be satisfactorily imaged in each of the first and second imaging systems.

The component mounter may be configured so that the first imaging unit is arranged at one side of the mounting head and faces the first imaging position provided with respect to a side surface of the mounting head on the one side; the second imaging unit is arranged at other side of the mounting head opposite to the one side and faces the second imaging position provided with respect to a surface of the mounting head on the other side; and the first illuminator irradiates the light toward the first imaging position from the other side of the mounting head and the second illuminator irradiates the light toward the second imaging position from the one side of the mounting head.

In such a configuration, the first imaging unit is arranged at one side of the mounting head and faces the first imaging position provided with respect to a side surface of the mounting head on the one side. Further, the first illuminator irradiates light to the first imaging position from the other side of the mounting head. Thus, the first imaging system obtains a silhouette image of the nozzle by imaging the light irradiated by the first illuminator from behind the nozzle at the first imaging position by the first imaging unit. Similarly, the second imaging system obtains a silhouette image of the nozzle by imaging the light irradiated by the second illuminator from behind the nozzle at the second imaging position by the second imaging unit.

In the case of arranging the first and second imaging systems as just described, the second illuminator of the second imaging system irradiates light toward the mounting head from the one side of the mounting head where the first imaging unit of the first imaging system is arranged. Thus, there is a possibility that the light irradiated from the second illuminator of the second imaging system and reflected by the mounting head is incident on the first imaging unit of the first imaging system to affect the imaging of the nozzle of the first imaging system. Similarly, there is a possibility that the light irradiated from the first illuminator of the first imaging system and reflected by the mounting head is incident on the second imaging unit of the second imaging system to affect the imaging of the nozzle of the second imaging system. However, since the influence of the illumination light used by each of the first and second imaging systems on the imaging of the nozzle corresponding to the other imaging system is suppressed, the silhouette image of the nozzle can be satisfactorily imaged in each of the first and second imaging systems.

Further, an advantage of suppressing the influence of the illumination light used by each of the first and second imaging systems on the imaging of the nozzle corresponding to the other imaging system can be utilized as follows. That is, the component mounter may be configured to further comprise a control unit configured to control the first imaging system and the second imaging system, wherein: two nozzles are so arranged in the mounting head as to satisfy an arrangement relationship that the other nozzle is located at the second imaging position at the same time as one nozzle is located at the first imaging position; and the control unit simultaneously performs the imaging of the nozzle located at the first imaging position by the first imaging system and the imaging of the nozzle located at the second imaging position by the second imaging system. In such a configuration, since the imaging of the nozzle located at the first imaging position by the first imaging system and the imaging of the nozzle located at the second imaging position by the second imaging system are simultaneously performed, the nozzles can be effectively imaged. In addition, since the influence of the illumination light used by each imaging system on the imaging of the nozzle corresponding to the other imaging system is suppressed, the nozzles can be satisfactorily imaged even if the imaging of each imaging system is simultaneously performed.

The component mounter may be configured so that the mounting head is a rotary head configured to rotate the nozzles along a circumferential obit centered about a predetermined rotation axis, and 2×N nozzles are arranged along the circumferential orbit by providing N pairs of nozzles, two nozzles constituting each pair being arranged at an angle of 180° about the rotation axis on the circumferential orbit, N being an integer equal to or greater than 1; the first imaging position and the second imaging position are provided at an interval of 180° about the rotation axis with respect to the circumferential orbit; and the two nozzles constituting the pair satisfy the arrangement relationship and are configured to be respectively simultaneously located at the first imaging position and the second imaging position. In this way, the plurality of nozzles held by the rotary head can be efficiently imaged.

The component mounter may be configured to further comprise a component supplying unit configured to supply components, wherein: the mounting head sucks the components supplied by the component supplying unit by the two nozzles satisfying the arrangement relationship; and the control unit simultaneously images the two nozzles performing the suction of the components and respectively located at the first imaging position and the second imaging position. In such a configuration, component sucking states of the two nozzles can be efficiently imaged.

The component mounter may be configured so that the first wavelength is a blue wavelength and the second wavelength is a red wavelength. In such a configuration, since a difference between the first wavelength and the second wavelength (difference between the blue wavelength and the red wavelength) is large, the first filter can effectively limit the transmission of the light of the second wavelength and the second filter can effectively limit the transmission of the light of the first wavelength. Thus, the influence of the illumination light used by each of the first and second imaging systems on the imaging of the nozzle corresponding to the other imaging system can be more reliably suppressed.

The invention claimed is:

1. A component mounter, comprising:
a first imaging system including a first illuminator configured to irradiate light of a first wavelength toward a first imaging position, a first filter configured to limit the transmission of light of a second wavelength different from the first wavelength while allowing the transmission of the light of the first wavelength, and a first imaging unit which faces the first imaging position is configured to receive light incident thereon from the first imaging position by a first imaging device;
a second imaging system including a second illuminator configured to irradiate light of the second wavelength toward a second imaging position different from the first imaging position, a second filter configured to limit the transmission of the light of the first wavelength while allowing the transmission of the light of the second wavelength, and a second imaging unit which faces second imaging position is configured to receive light incident thereon from the second imaging position by a second imaging device;
a mounting head configured to hold a component by a nozzle of a plurality of nozzles, position the nozzle at the first imaging position and position the nozzle at the second imaging position;
two nozzle facing parts arranged to sandwich two of the nozzles;
a light diffusing member;
a control unit configured to control the first imaging system and the second imaging system, wherein
the first imaging unit is arranged at one side of the mounting head and faces the first imaging position provided with respect to a side surface of the mounting head on the one side;
the second imaging unit is arranged at other side of the mounting head opposite to the one side and faces the second imaging position provided with respect to a surface of the mounting head on the other side;
the first illuminator irradiates the light toward the first imaging position from the other side of the mounting head and the second illuminator irradiates the light toward the second imaging position from the one side of the mounting head;
the first imaging system images the nozzle located at the first imaging position in a horizontal direction by receiving the light transmitted through the first filter after being irradiated to the first imaging position from the first illuminator by the first imaging device of the first imaging unit;
the second imaging system images the nozzle located at the second imaging position in a horizontal direction by receiving the light transmitted through the second filter after being irradiated to the second imaging position from the second illuminator by the second imaging device of the second imaging unit;

two of the nozzles are so arranged in the mounting head as to satisfy an arrangement relationship that an other of the nozzles is located at the second imaging position at the same time as one of the nozzles is located at the first imaging position;

the light diffusing member is arranged between the one of the nozzles located at the first imaging position and the other of the nozzles located at the second imaging position;

the light emitted from the first illuminator is irradiated to the first imaging position after being diffused by the light diffusing member;

the light emitted from the second illuminator is irradiated to the second imaging position after being diffused by the light diffusing member;

among the two nozzle facing parts, a first window facing to the first imaging position is provided in the nozzle facing part on the one side and a second window facing to the second imaging position is provided in the nozzle facing part on the other side;

the first imaging unit receives light incident thereon from the first imaging position to the first window by the first imaging device;

the second imaging unit receives light incident thereon from the second imaging position to the second window by the second imaging device;

among the two nozzle facing parts, the second illuminator is arranged at the nozzle facing part on the one side and the first illuminator is arranged at the nozzle facing part on the other side; and the control unit simultaneously performs the imaging of the one of the nozzles located at the first imaging position by the first imaging system and the imaging of the other of the nozzles located at the second imaging position by the second imaging system.

2. The component mounter according to claim 1, wherein:

the mounting head is a rotary head configured to rotate the nozzles along a circumferential orbit centered about a predetermined rotation axis, and 2×N nozzles are arranged along the circumferential orbit by providing N pairs of nozzles, two nozzles constituting each pair being arranged at an angle of 180° about the rotation axis on the circumferential orbit, N being an integer equal to or greater than 1;

the first imaging position and the second imaging position are provided at an interval of 180° about the rotation axis with respect to the circumferential orbit; and the two nozzles constituting the pair satisfy the arrangement relationship and are configured to be respectively simultaneously located at the first imaging position and the second imaging position.

3. The component mounter according to claim 2, further comprising:

a component supplying unit configured to supply components, wherein:

the mounting head sucks the components supplied by the component supplying unit by the two nozzles satisfying the arrangement relationship; and the control unit simultaneously images the two nozzles performing the suction of the components and respectively located at the first imaging position and the second imaging position.

4. The component mounter according to claim 3, wherein the first wavelength is a blue wavelength and the second wavelength is a red wavelength.

5. The component mounter according to claim 2, wherein the first wavelength is a blue wavelength and the second wavelength is a red wavelength.

6. The component mounter according to claim 1, further comprising:

a component supplying unit configured to supply components, wherein:

the mounting head sucks the components supplied by the component supplying unit by the two nozzles satisfying the arrangement relationship; and the control unit simultaneously images the two nozzles performing the suction of the components and respectively located at the first imaging position and the second imaging position.

7. The component mounter according to claim 6, wherein the first wavelength is a blue wavelength and the second wavelength is a red wavelength.

8. The component mounter according to claim 1, wherein the first wavelength is a blue wavelength and the second wavelength is a red wavelength.

9. A nozzle imaging method, comprising:

locating nozzles used by a mounting head to hold components at a first imaging position provided with respect to a side surface of the mounting head on one side and at a second imaging position provided with respect to a side surface of the mounting head on other side opposite to the one side;

irradiating light of a first wavelength toward the first imaging position from the other side of the mounting head and irradiating light of a second wavelength different from the first wavelength toward the second imaging position from the one side;

imaging one of the nozzles located at the first imaging position in a horizontal direction by receiving the light transmitted through a first filter after being irradiated to the first imaging position by a first imaging device of a first imaging unit arranged at the one side of the mounting head to face the first imaging position and imaging an other of the nozzles located at the second imaging position in a horizontal direction by receiving the light transmitted through a second filter after being irradiated to the second imaging position by a second imaging device of a second imaging unit arranged at the other side of the mounting head to face the second imaging position, the first filter limiting the transmission of the light of the second wavelength while allowing the transmission of the light of the first wavelength and the second filter limiting the transmission of the light of the first wavelength while allowing the transmission of the light of the second wavelength; and controlling the first imaging unit and the second imaging unit, wherein:

two of the nozzles are so arranged in the mounting head as to satisfy an arrangement relationship that the other of the nozzles is located at the second imaging position at the same time as the one of the nozzles is located at the first imaging position;

two nozzle facing parts are arranged to sandwich two of the nozzles;

a light diffusing member is arranged between the one of the nozzles located at the first imaging position and the other of the nozzles located at the second imaging position;

the light emitted from a first illuminator is irradiated to the first imaging position after being diffused by the light diffusing member;

the light emitted from a second illuminator is irradiated to the second imaging position after being diffused by the light diffusing member;

among the two nozzle facing parts, a first window facing to the first imaging position is provided in the nozzle facing part on the one side and a second window facing to the second imaging position is provided in the nozzle facing part on the other side;

the first imaging unit receives light incident thereon from the first imaging position to the first window by the first imaging device;

the second imaging unit receives light incident thereon from the second imaging position to the second window by the second imaging device;

among the two nozzle facing parts, the second illuminator is arranged at the nozzle facing part on the one side and the first illuminator is arranged at the nozzle facing part on the other side; and a control unit controls the first imaging device and the second imaging device, and the control unit simultaneously performs the imaging of the one of the nozzles located at the first imaging position by the first imaging device and the imaging of the other of the nozzles located at the second imaging position by the second imaging device.

* * * * *